(12) United States Patent
Ma

(10) Patent No.: US 8,939,778 B2
(45) Date of Patent: Jan. 27, 2015

(54) ELECTRCIAL SOCKET WITH LGA TYPE COIL CONTACTS FOR IC PACKAGE

(71) Applicant: Hao-Yun Ma, Santa Clara, CA (US)

(72) Inventor: Hao-Yun Ma, Santa Clara, CA (US)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/737,967

(22) Filed: Jan. 10, 2013

(65) Prior Publication Data

US 2014/0193988 A1 Jul. 10, 2014

(51) Int. Cl.
*H01R 12/52* (2011.01)
*H01R 12/70* (2011.01)
*H05K 7/00* (2006.01)

(52) U.S. Cl.
CPC ............ *H01R 12/52* (2013.01); *H01R 12/7082* (2013.01); *H05K 7/00* (2013.01)
USPC .......................................................... 439/83

(58) Field of Classification Search
CPC ....................................................... H01R 12/57
USPC ..................................................... 439/74, 83
See application file for complete search history.

(56) References Cited

U.S. PATENT DOCUMENTS

| | | | | |
|---|---|---|---|---|
| 4,950,173 A * | 8/1990 | Minemura et al. | ............... | 439/82 |
| 6,494,725 B2 * | 12/2002 | Lin et al. | ........................ | 439/83 |
| 6,561,831 B1 * | 5/2003 | McHugh et al. | ............... | 439/342 |
| 6,814,623 B2 * | 11/2004 | Hashiba | ........................ | 439/660 |
| 7,435,109 B1 * | 10/2008 | Sugiura | ........................... | 439/83 |
| 7,731,507 B1 * | 6/2010 | Ju | ..................................... | 439/71 |
| 8,079,851 B1 * | 12/2011 | Ma | .................................... | 439/83 |
| 8,439,709 B2 * | 5/2013 | Fan | ................................ | 439/660 |
| 2005/0250354 A1 * | 11/2005 | Vinther | ........................... | 439/66 |
| 2007/0269999 A1 * | 11/2007 | Di Stefano | ..................... | 439/73 |
| 2009/0053914 A1 * | 2/2009 | Ma | ................................. | 439/83 |
| 2013/0210276 A1 * | 8/2013 | Rathburn | ................. | 439/620.22 |
| 2014/0193988 A1 * | 7/2014 | Ma | ................................. | 439/83 |

FOREIGN PATENT DOCUMENTS

TW        I367360        12/2009

* cited by examiner

*Primary Examiner* — James Harvey

(74) *Attorney, Agent, or Firm* — Wei Te Chung; Ming Chieh Chang

(57) ABSTRACT

An electrical socket includes an insulating housing, a plurality of contacts, an upper film permanently attached to the top face and a lower film permanently attached to the bottom face. The insulating housing defines a top face and a bottom face, and a plurality of through holes through the top and bottom faces. The contacts are retained in the insulating housing and the contacts comprise elastic portions received in the through holes, contacting portions and connecting portions. The contacting portions and connecting portions integrally connected with opposite ends of the elastic portions respectively. The contacting portions run through the upper film and the connecting portions run through lower film.

14 Claims, 6 Drawing Sheets

ELECTRCIAL SOCKET WITH LGA TYPE COIL CONTACTS FOR IC PACKAGE

BACKGROUND OF THE INVENTION

1. Field of the Invention

The present invention relates to an electrical socket with LGA type coil contacts for an IC CPU package, such as a CPU module used in notebook.

2. Description of Related Art

Taiwan Patent No. 1367330 discloses a probe socket for electrically connecting an IC package and a printed circuit board. The probe socket comprises a plurality of elastic contact pins, a mid-air base body and a covering board. The elastic contact pin comprises a first contacting end, a second contacting end and an elastomer connecting the two contacting ends. The elastomer is retained between the base body and the covering board. However, the structure of socket is a little complex.

Hence, an electrical socket with a simpler structure is desired.

BRIEF SUMMARY OF THE INVENTION

Accordingly, an object of the present invention is to provide an electrical socket providing a better electrical connection.

To achieve the above object, an electrical socket includes an insulating housing, a plurality of contacts, an upper film permanently attached to the top face and a lower film permanently attached to the bottom face. The insulating housing defines a top face and a bottom face, and a plurality of through holes through the top and bottom faces. The contacts are retained in the insulating housing and the contacts comprise elastic portions received in the through holes, contacting portions and connecting portions. The contacting portions and connecting portions integrally connected with opposite ends of the elastic portions respectively. The contacting portions run through the upper film and the connecting portions run through lower film.

DETAILED DESCRIPTION OF THE PREFERRED EMBODIMENTS

Figure 1:
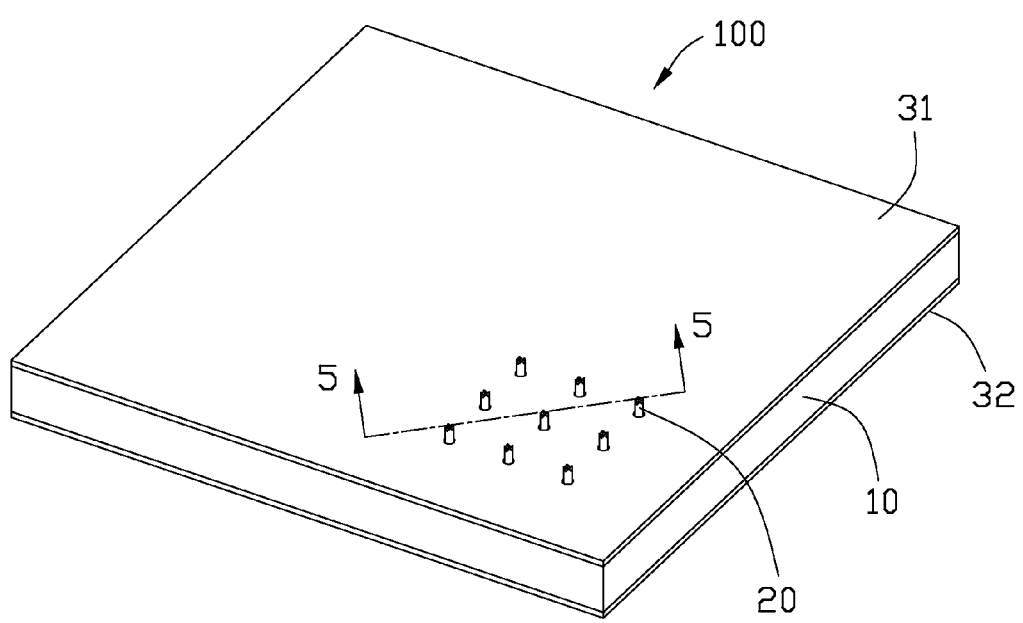
FIG. 1 is a perspective view of an electrical socket accordance with a preferred embodiment of the present invention.

Reference will now be made to the drawing figures to describe the preferred embodiment of the present invention in details. FIGS. 1~5 illustrate an electrical socket 100 for an IC package such as a CPU module (not shown). The other components such as a shell, a base and so on, are not shown in the figures since they are convenient.

Figure 2:
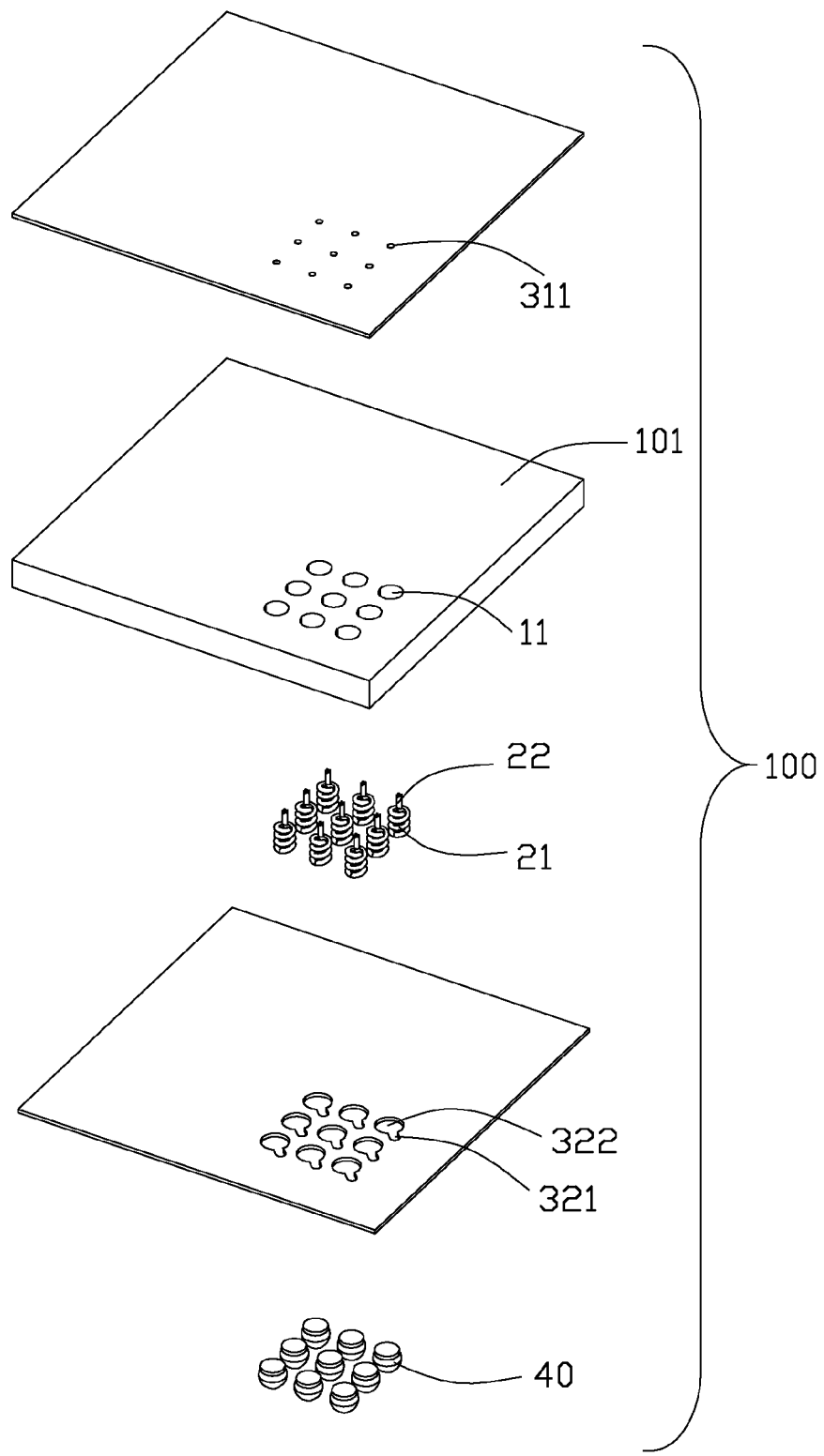
FIG. 2 is an exploded view of the electrical socket shown in FIG. 1.
Figure 3:
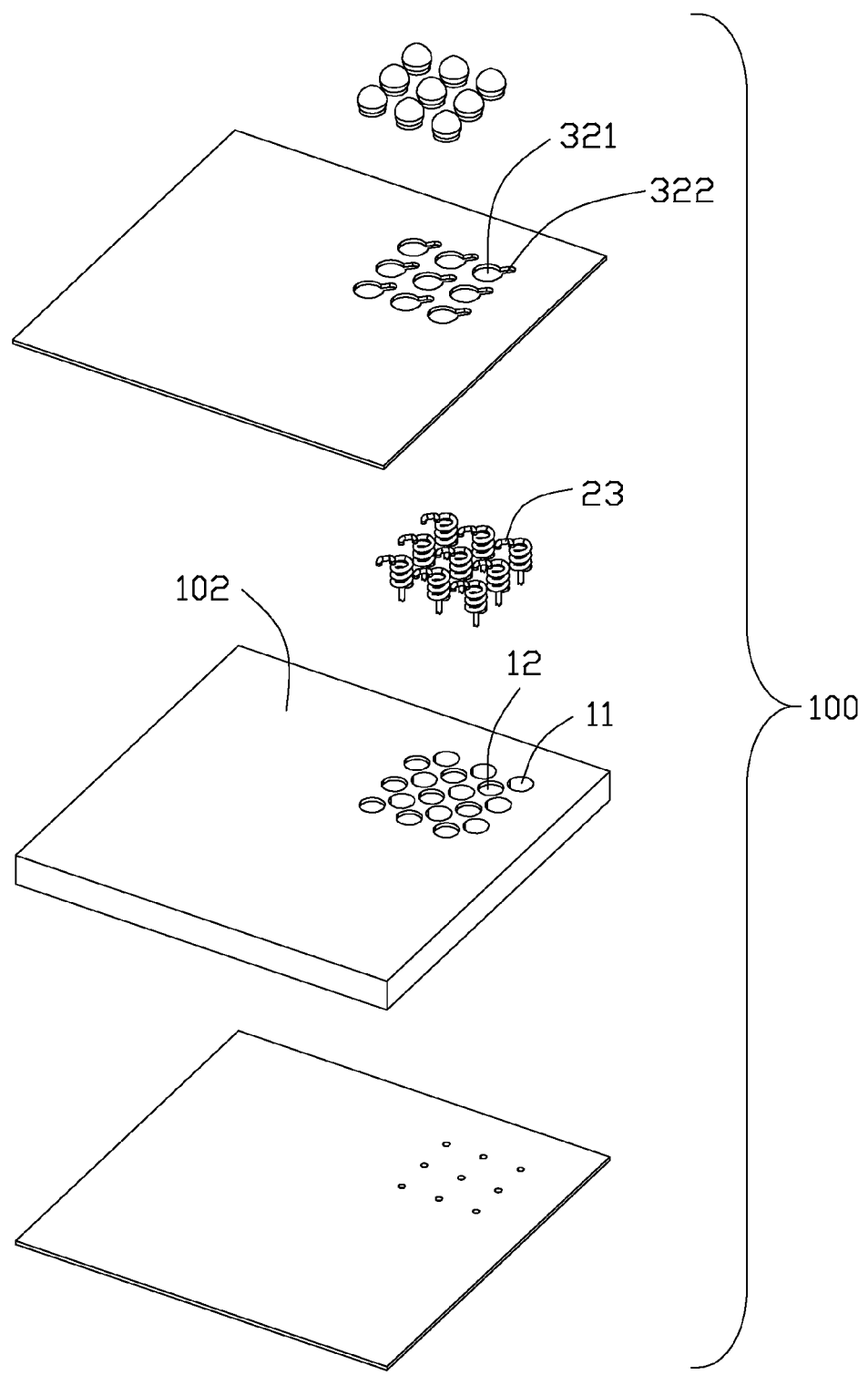
FIG. 3 is an exploded view of the electrical socket shown in FIG. 1.

Referring to FIGS. 2-3, the electrical socket 100 comprises an insulating housing 10, a plurality of contacts 20 received in the insulating housing 10 and upper and lower films 31, 32 permanently attached to two opposite surfaces 101, 102 of the housing to limit the contacts 20 in the housing 10. Each contact 20 comprises an elastic portion 21 in a form of coil spring, a contacting portion 22 in a form of pin shape extending from one free end of the elastic portion 21 and a connecting portion 23 horizontally extending from the other free end of the elastic portion 21. The contacting portion 22 defines several sawteeth 221 labeled in FIG. 5 to mate with the CPU module. The connecting portions 23 are used to connect with solder balls 40 so as to be mounted to a PCB (not shown). The connecting portions 23 project horizontally and the contacting portions 22 project downwards.

The insulating housing defines a plurality of through holes 11 running through the bottom surface 102 and the top surface 101 and a plurality of recesses 12. The through holes and the recesses 12 are alternatively arranged in rows. The recesses 12 are disposed at the bottom surface 102 only. The contacts 20 are assembled in the through holes 11 from the bottom surface 102 in a condition that the elastic portions 21 are received in the through holes 11 and the connecting portions 23 extend into corresponding adjacent recesses 12 at a distal end 234 thereof. Thus the connecting portions are offset from the terminal holes in a first direction perpendicular to the first and second faces. As a result, the connecting portions 23 project from the bottom surface 102 and the contacting portions 22 project from the top surface 101.

Figure 4:
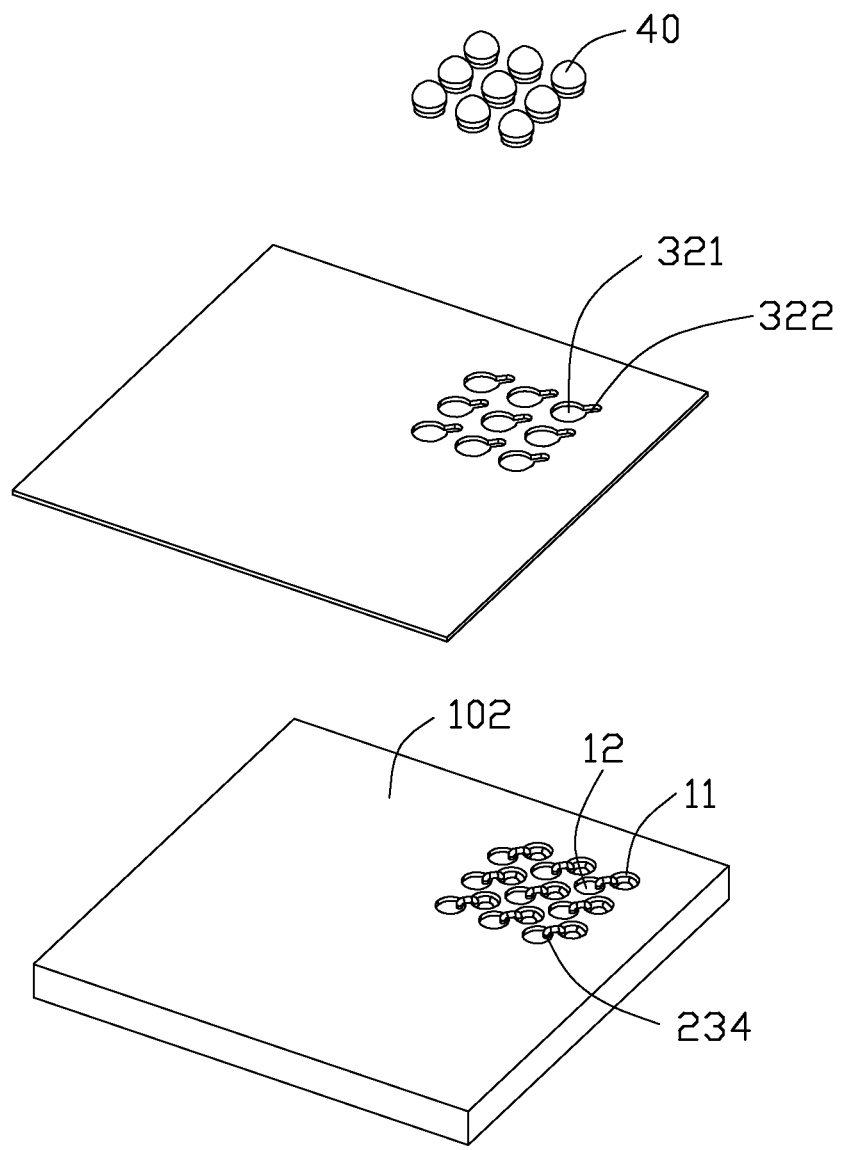
FIG. 4 is a perspective view of the electrical socket without lower and upper films.

Combination with FIG. 4, the upper film 31 defines plurality of rows of first retaining holes 311 aligned with the through holes 11 one by one, thereby the contacting portions 21 projecting through the first retaining holes 311. The lower film 32 defines a plurality of rows of second retaining holes 321 aligned with the recesses 12 and slits 322 connecting with the second retaining holes 321, thereby the connecting portions 23 are received in the slots and the second retaining holes 321. The first retaining holes 311 are smaller than the elastic portions 21 in size. Thus the elastic portions 21 can be deformed in the through holes 11 and the elastic portions 21 are retained in the through holes 11 stably. The elastic portions 21 are able to expand and contract freely when mated to the CPU module. Please notes in FIG. 5, the contacts 20 are limited in the through holes 11 by the upper film 31 since the first retaining holes 311 only allow the contacting portion 22 to run through and by the lower film 32 since the slits 322 only allow the horizontal portions 233 of connecting portions 23 to run through. As best shown in FIG. 4, the solder balls are pre-positioned in the recesses 12 and melted to connect with the distal ends 234 of the connecting portions 23. When the electrical connector is attached with the PCB, the solder balls 40 are melted to connect with the PCB. Alternatively, the lower film 32 is attached to the housing firstly, then the solder balls 40 are positioned in recesses 12 through the second retaining holes 321.

Figure 5:
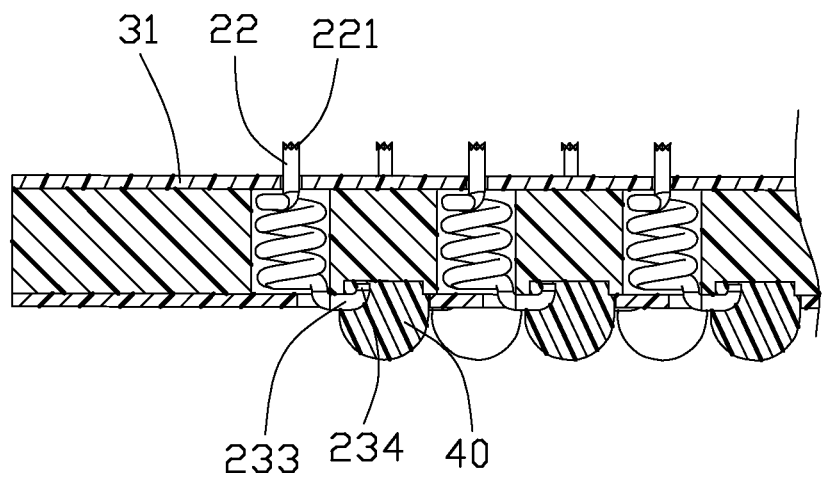
FIG. 5 is a cross-section view of the electrical socket along taken along lines 5-5 in FIG. 1.
Figure 6:
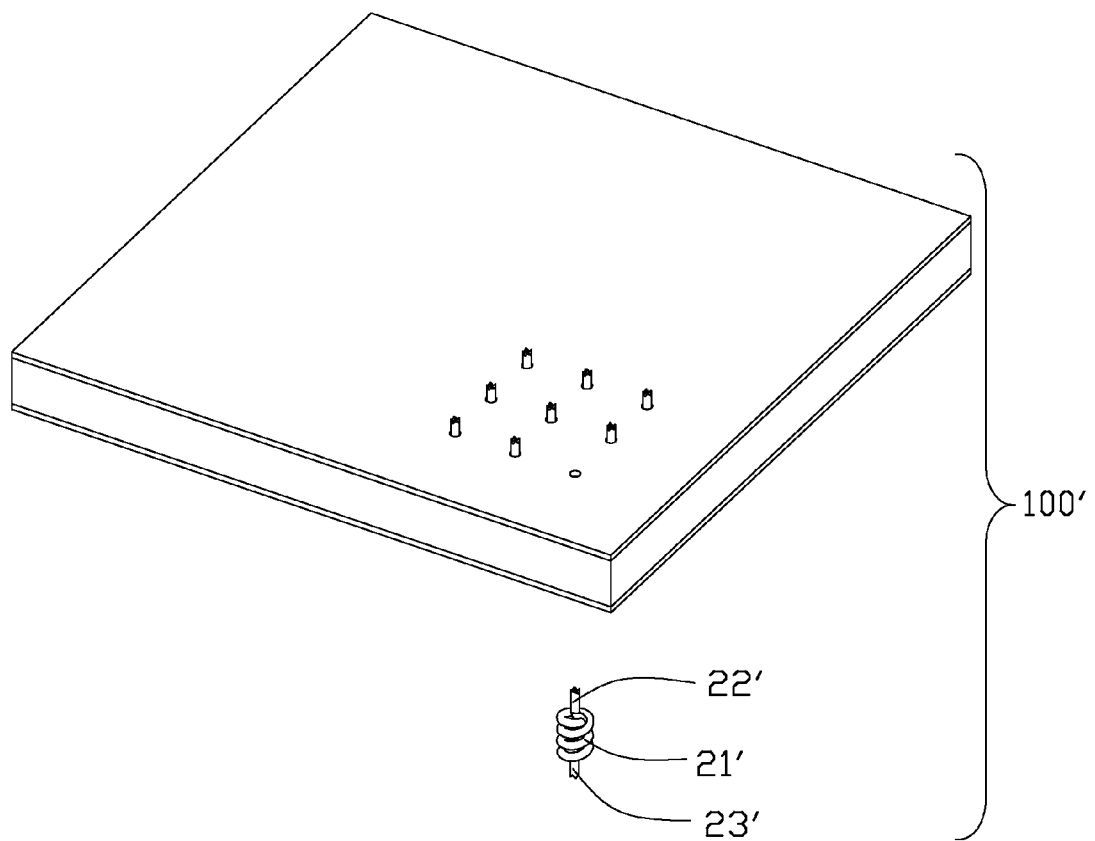
FIG. 6 is a general view of an electrical socket accordance with another preferred embodiment of the present invention.

Referring to FIG. 5 illustrating an alternative embodiment, the electrical connector 100' is similar to the above-mentioned electrical connector 100 except for the connecting portion 23' is in a form of pin shape. The connecting portion 23' is aligned with the contacting portion 22' in an upper-to-lower direction and soldered by through-hole type to provide a stable electrical connection.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket, comprising:
   an insulating housing defining a top face and a bottom face, and a plurality of through holes through the top and bottom faces;
   a plurality of contacts retained in the insulating housing, the contacts comprising elastic portions received in the through holes, contacting portions and connecting portions, the contacting portions and connecting portions integrally connecting with opposite ends of the elastic portions respectively;
   an upper film permanently attached to the top face and a lower film permanently attached to the bottom face to limit the contacts in the through holes;
   wherein the contacting portions run through the upper film and the connecting portions run through the lower film;
   wherein the bottom face of the housing defines a plurality of recesses adjacent to the through holes correspondingly, the connecting portions extend in the recesses to be joined with melted solder balls in the recesses;
   wherein the lower film defines a plurality of second retaining holes aligned with the recesses and a plurality of slits to receive parts of the connecting portions so that the connecting portions are flush with the lower film.

2. The electrical socket as claimed in claim 1, wherein the contacting portions are shaped in a pin and perpendicular to the top face, the elastic portions are in a coil-spring shape.

3. An electrical socket comprising: an insulative housing defining therein plural pairs of holes arranged in matrix; each of said pairs defines a first hole extending through opposite first and second surfaces of said housing in a vertical direction, and a second hole located beside the first hole in a transverse direction perpendicular to said vertical direction; a plurality of contacts disposed in the corresponding first holes, respectively, each of said contacts defines a contacting end extending beyond the first surface, and a connecting end transversely extending into the corresponding second hole; and a plurality of solder balls disposed in the corresponding second holes around the second surface, respectively, and mechanically and electrically connected to the connecting end of the corresponding contact; wherein an insulative film located upon the second surface and covering the first holes while having corresponding through holes to expose the second holes for allowing the corresponding solder balls to communicate with an exterior.

4. The electrical socket as claimed in claim 3, wherein said contacts are of a coil spring type.

5. An electrical socket, comprising:
   a housing defining a plurality of terminal holes extending along a vertical direction between opposite first and second faces; and
   a plurality of contacts loaded in the housing, each of the contacts comprising an elastic portion received in the terminal hole, a contacting pin projecting from the first face of the housing and a connecting portions connecting with a solder ball at the second face of the housing;
   wherein the solder portions are respectively offset from the terminal holes in a transverse direction perpendicular to the vertical direction;
   wherein the second face of the housing defines a plurality of recesses to receive the soldering balls, the connecting portions extend into the recesses;
   wherein a first film and a second film are attached to the first and second faces of the housing respectively, the first film defines first retaining holes to only allow the contacting pins to run through, the second film defines second retaining holes to allow the solder balls to run through and slits to receive the connecting portions.

6. The electrical socket as claimed in claim 3, wherein said first hole defines a constant diameter in the vertical direction.

7. The electrical socket as claimed in claim 3, wherein the first hole is isolated from the corresponding second hole in the transverse direction.

8. The electrical socket as claimed in claim 5, wherein the contacting portions define sawteeth exposing to the first face.

9. The electrical socket as claimed in claim 5, wherein said contact is of a coil spring type.

10. The electrical socket as claimed in claim 5, wherein the terminal holes and the corresponding recesses are arranged diagonally.

11. The electrical socket as claimed in claim 5, wherein said terminal holes and the corresponding recesses are isolated from each other.

12. The electrical socket as claimed in claim 3, wherein the first hole and the corresponding second hole are arranged diagonally with each other.

13. The electrical socket as claimed in claim 3, wherein said insulative film further defines a plurality of slits communicatively beside the corresponding through holes, respectively, to respectively receive the connecting ends of the corresponding contacts therein.

14. The electrical socket as claimed in claim 3, further including another insulative film located upon the first surface to cover the first holes while being equipped with a plurality of tiny through holes to allow the contacting ends of the corresponding contacts to extend therethrough to communicate with the exterior.

* * * * *